United States Patent
McMorrow

(10) Patent No.: US 6,642,784 B2
(45) Date of Patent: Nov. 4, 2003

(54) CALIBRATED POWER AMPLIFIER MODULE

(75) Inventor: Robert J. McMorrow, Concord, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/017,526

(22) Filed: Dec. 14, 2001

(65) Prior Publication Data

US 2002/0175751 A1 Nov. 28, 2002

Related U.S. Application Data

(60) Provisional application No. 60/292,782, filed on May 22, 2001.

(51) Int. Cl.[7] .......................... H03G 3/20; G01R 19/00
(52) U.S. Cl. ........................................... 330/129; 330/2
(58) Field of Search ..................... 330/2, 129

(56) References Cited

U.S. PATENT DOCUMENTS

| | | | |
|---|---|---|---|
| 4,990,803 A | 2/1991 | Gilbert | 307/492 |
| 5,129,098 A * | 7/1992 | McGirr et al. | 455/69 |
| 5,655,220 A * | 8/1997 | Weiland et al. | 455/69 |
| 6,128,477 A * | 10/2000 | Freed | 455/115 |
| 6,370,364 B1 * | 4/2002 | Liimatainen | 455/126 |

FOREIGN PATENT DOCUMENTS

| | | |
|---|---|---|
| WO | WO 99/39449 | 8/1999 |
| WO | WO 99/67893 | 12/1999 |

* cited by examiner

*Primary Examiner*—Patricia Nguyen
(74) *Attorney, Agent, or Firm*—Bromberg & Sunstein LLP

(57) ABSTRACT

A power amplifier module includes an input for receiving a signal having an input power level, at least one power amplifier coupled to the input to increase the input power level of the signal to an output power level and a power calibration and control module coupled to the power amplifier for measuring the output power level and correcting the output power level measurement based on a set of factors. The power calibration and control module further controls the at least one power amplifier to produce an output power level equivalent to a target power level. The power calibration and control module may include a power detector, a power calibrator and a power controller. The power amplifier module may further include a power set interface coupled to the power calibration and control module for providing the target power level.

29 Claims, 5 Drawing Sheets

CALIBRATED POWER AMPLIFIER MODULE

This application claims priority from U.S. provisional patent application serial No. 60/292,782, filed May 22, 2001, entitled "Calibrated Power Amplifier Module" and bearing attorney docket number 2550/104, the disclosure of which is incorporated herein, in its entirety, by reference.

FIELD OF THE INVENTION

The invention relates generally to power amplifiers and, more particularly, to power measurement and control in a power amplifier.

BACKGROUND OF THE INVENTION

Power amplifiers (PAs) may be used in a variety of applications to increase the power level of a signal. For example, a power amplifier may be used as the final gain stage in the transmitter of a mobile handset terminal (e.g., a mobile phone). Typically, power measurement and control is required to ensure compliance with regulations imposed on RF emissions and output power. It is also desirable to minimize power consumption by operating at the lowest possible output power levels. The power measurement and control performed at a final test stage of a mobile handset device generally requires a calibration step to program correction coefficients into the mobile handset to compensate for measurement errors. This can be a time consuming and costly process that is generally performed on every mobile handset manufactured by a vendor. In addition, this is a redundant measurement as the manufacturer of the power amplifier also measures the output power of each power amplifier to ensure compliance with specifications.

FIG. 1 is a schematic block diagram of an exemplary GSM (Global System for Mobile communication) transmitter for a mobile handset terminal. A power amplifier module (PAM) 102, coupler 114 and power detector 118 are used to create closed loop power control. Power amplifier module 102 includes a power amplifier integrated circuit 104 and a power controller integrated circuit 106. The power amplifier module 102 may also include RF matching elements 108, filters 110 and RF switches 112. Power amplifier module 102 is used to adjust the input power level of an RF signal to a required power level and deliver the RF signal with an output power level to an antenna 116 load.

To control the output power level of the RF signal, a coupler 114 samples the output power level of the signal and sends the sample to a power detector 118. The power detector 118 may be, for example, a logarithmic amplifier. The sampled output power is measured by the power detector 118 and the measured power is delivered to the power controller 106. Power controller 106 compares the measured power to a power set voltage 120 (i.e., a voltage level corresponding to the desired power level) input to the power controller 106. The manufacturer of the mobile handset terminal must provide a power set voltage 120 that has been corrected (or calibrated) for error caused by various factors such as temperature variation, detector variation with power level and filter/coupler loss variations. A manufacturer may, for example, apply an algorithm to adjust the power set voltage 120 for the average non-linearity of the detector. These calibration corrections are then stored in memory in the mobile handset terminal.

The power controller 106 then controls the power amplifier 104 based on the comparison of the measured output power to the power set voltage so that the output power level of the power amplifier matches the desired power level. Generally, a manufacturer of a mobile handset will measure the power of each hand set after assembly and program the correction factors into the handset memory. As mentioned above, this can be a costly and time-consuming process. In addition, the process is redundant since each PAM 102 itself must be measured against power specifications.

SUMMARY OF THE INVENTION

In accordance with one aspect of the invention, a power amplifier module includes an input for receiving a signal having an input power level, at least one power amplifier to increase the input power level of the signal to an output power level, a power detector to measure the output power level, a power controller for comparing the output power level to a target power level and producing a control signal for the power amplifier based on the comparison and a power calibrator for determining a correction based on a set of factors. A power set interface may be coupled to the power controller to provide the target power level. The power amplifier module may further include a power sampling element for sampling a portion of the output power level and delivering the sampled output power to the power detector.

In one embodiment, the power calibrator adjusts the target power level based on the correction. Alternatively, the power calibrator may adjust the measured output power level provided by the power detector or the control signal produced by the power controller.

In another embodiment, the power detector is a logarithmic amplifier. The power calibrator may include a set of laser trimmed resistors. In a further embodiment, the power amplifier module further includes a set of calibration pins coupled to the power calibrator for receiving a voltage to program at least one of the set of factors. Alternatively, the set of factors may be digitally programmable. The power set interface may be a digital or analog interface. In yet another embodiment, the power amplifier, the power detector, the power controller and the power calibrator are implemented on a single semiconductor die. The power amplifier module may further include RF matching elements or RF switches. The power set interface may provide a controlled power burst for GSM and EDGE signals.

In accordance with another aspect of the invention, a power amplifier module includes an input for receiving a signal with an input power level, at least one power amplifier for increasing the input power level of the signal to an output power level and means for measuring the output power level. The power amplifier module also includes means for comparing the measured output power level to a target power level and producing a control signal and means for adjusting at least one of the measured output power level, the target power level and the control signal using a correction based on a set of factors.

In one embodiment, the power amplifier module further includes a power set interface for providing the target power level. In another embodiment, the power amplifier module further includes means for sampling the output power level from the at least one power amplifier. A set of calibration pins may be coupled to the means for adjusting to receive a voltage to program at least one of the set of factors. Alternatively, the set of factors may be digitally programmable. The power set interface may be a digital or analog interface.

In accordance with another aspect of the invention, a power amplifier module includes an input for receiving a signal having an input power level, at least one power amplifier to increase the input power level of the signal to an output power level. The power amplifier module further includes a power calibration and control module for measuring the output power level and correcting the output power level measurement based on a set of factors. The power calibration and control module may also control the at least one power amplifier to produce an output power level equivalent to a target power level.

In one embodiment, the power amplifier module further includes a power set interface coupled to the power calibration and control module for providing the target power level. The power set interface may be a digital interface or an analog interface. In another embodiment, the power amplifier module includes at least one power sampling element coupled to the at least one power amplifier and the power detector for sampling a portion of the output power level of the signal and delivering the sampled output power level to the power calibration and control module.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In an embodiment of the invention, a power amplifier module (PAM) includes calibration and power control functions to correct a measured output power of the PAM and to adjust the output power of the PAM to match a desired power level over temperature and dynamic power level ranges. The calibration function is incorporated into a final test routine of the PAM by adding calibration circuitry to the PAM. The calibration circuitry advantageously provides one-time programmable corrections to the output power level of the PAM before the PAM is incorporated into an application, such as a mobile handset terminal. While embodiments of the invention will be described generally with reference to mobile handset terminals, it is to be understood that many signal transmission applications may similarly benefit from various embodiments and improvements that are subjects of the present invention.

Figure 1:
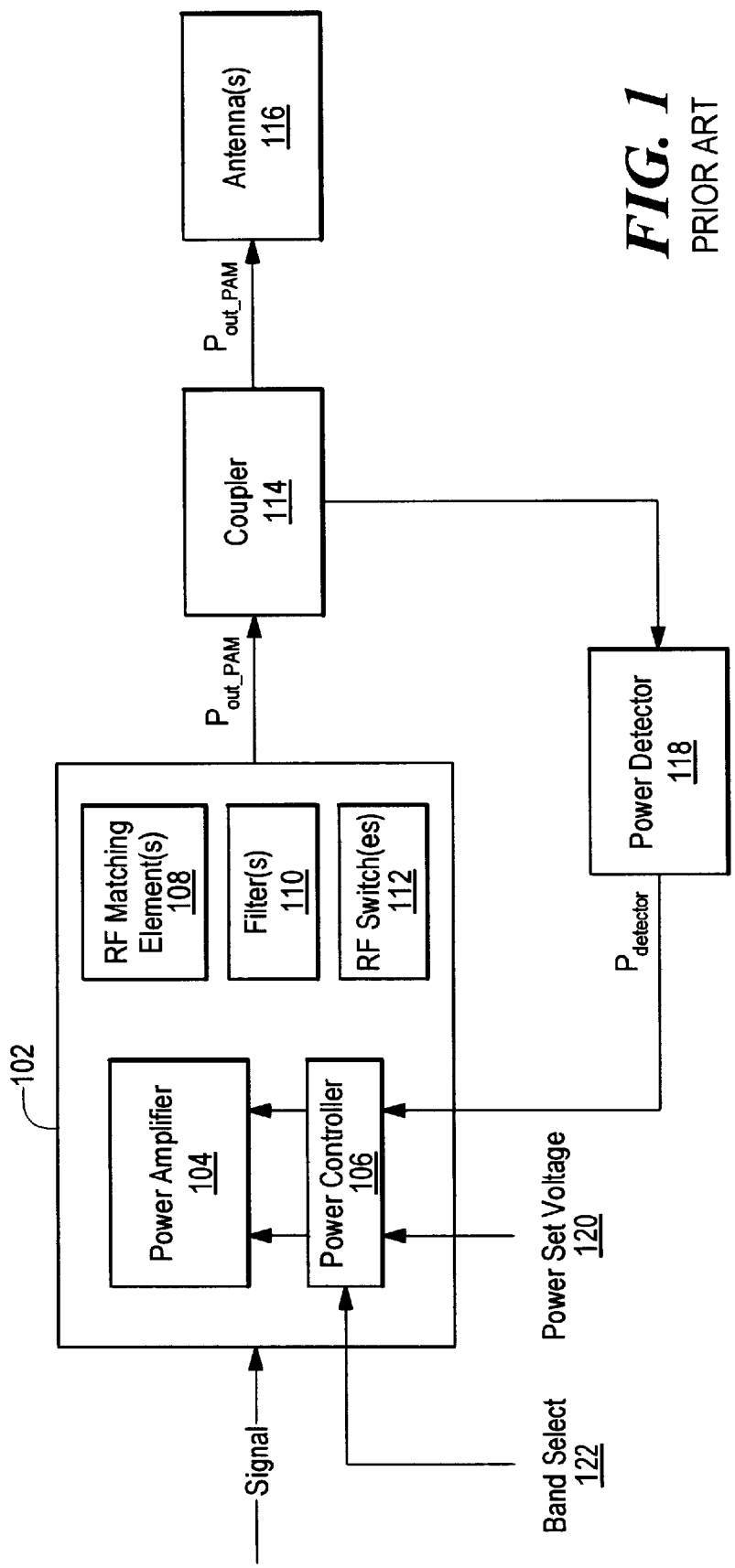
FIG. 1 is a schematic block diagram of an exemplary GSM transmitter for a mobile handset device.
Figure 2A:
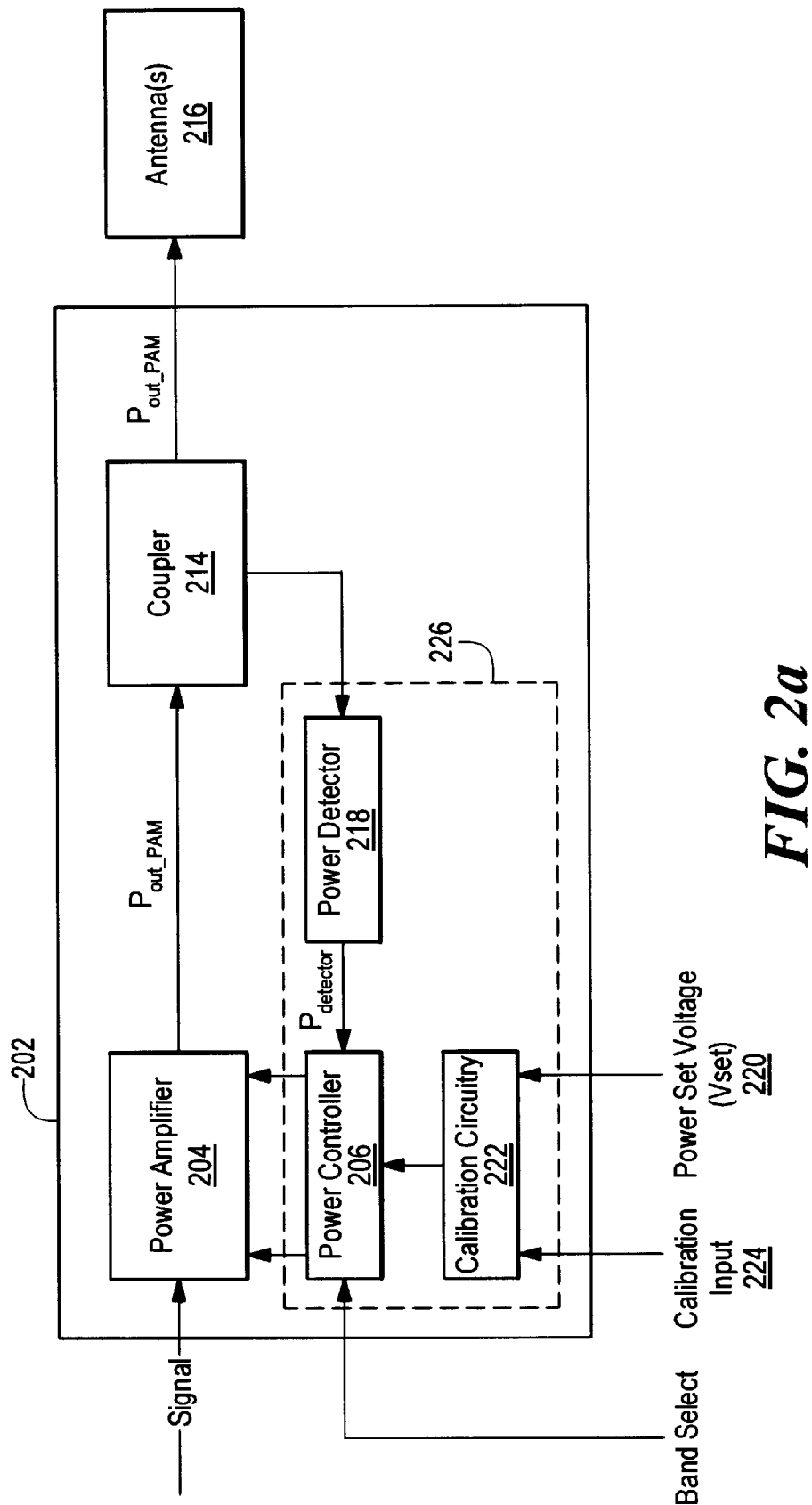
FIG. 2a is a schematic block diagram of a calibrated power amplifier module in accordance with an embodiment of the present invention.

FIG. 2a is a schematic block diagram of a calibrated power amplifier module in accordance with an embodiment of the invention. Power amplifier module 202 includes at least one power amplifier integrated circuit 204 to boost the input power level of an RF signal to the required power level. The power amplifier 204 may be, for example, a Gallium Arsenide (GaAs) or Silicon power amplifier integrated circuit. The RF signal with an output power level ($P_{out\_PAM}$) is delivered from PAM 202 to an antenna 216 load.

PAM 202 also advantageously includes an integrated power control loop that includes a coupler 214 and a power control and calibration unit 226 to control and correct the output power of the RF signal and to adjust the output power to match the required power level. Coupler 214 is used to sample a portion of the output power level ($P_{out\_PAM}$) of the RF signal and send it to the power control and calibration unit 226. Coupler 214 may be any coupler generally known in the art. In one embodiment, coupler 214 may be a directive coupler such as that described in further detail in co-pending U.S. patent application Ser. No. 10/016,876, filed on even date herewith, entitled "Active Coupler,".

The power control and calibration unit 226 is used to measure and correct the output power to compensate for errors in the power measurement due to various system variables. In addition, the power control and calibration unit 226 controls the output power level ($P_{out\_PAM}$) produced by the power amplifier 204 so it will match a desired power level. Power control and calibration unit 226 includes a power detector 218, calibration circuitry 222, and a power controller integrated circuit 206. Power detector 218 receives the sampled output power of the RF signal from the coupler 214. The power detector 218 may be, for example, a logarithmic amplifier, detector diodes or an RMS power detector. Power detector 218 measures the sampled output power and delivers a reference voltage proportional to the output power to the power controller 206. The power controller 206 compares the required power level to the measured output power and based on this comparison produces an appropriate control signal to control the power amplifier.

The required power level is set using a power set voltage 220 input to the power controller 206. The power set voltage may first pass through the calibration circuitry as shown in FIG. 2a. Either an analog or digital power set interface may be used to set the required power level. In the case of an analog power set interface, the power set voltage is the true power set point in dBm/volt, for a digital power set interface, the power set voltage is the true power set point in dBm/bit. The power set interface is used to determine the required power level based on factors such as where a user is located, transmission standards, etc. In addition, the power set interface may include elements to provide a controlled power burst required for GSM and EDGE (Enhanced Data GSM Environment) signals.

Once the power set voltage 220 has been provided to define the required power level ($P_{set}$), the power controller 206 compares the measured output power ($P_{detector}$) of the signal to the required power ($P_{set}$). The comparison value, $P_{detector}$ vs. $P_{set}$, is then used to provide an appropriate control signal to the power amplifier to adjust the output of PAM 202 to match the required power level. In addition, calibration circuitry 222 is used to calculate any correction (or adjustment) needed to compensate for errors in the power measurements caused by various factors such as temperature variations, frequency variations, detector variation with power level or filter/coupler loss variations. The addition of these corrections should produce an exact relationship between the actual output power from the PAM and $V_{set}$.

Figure 2B:
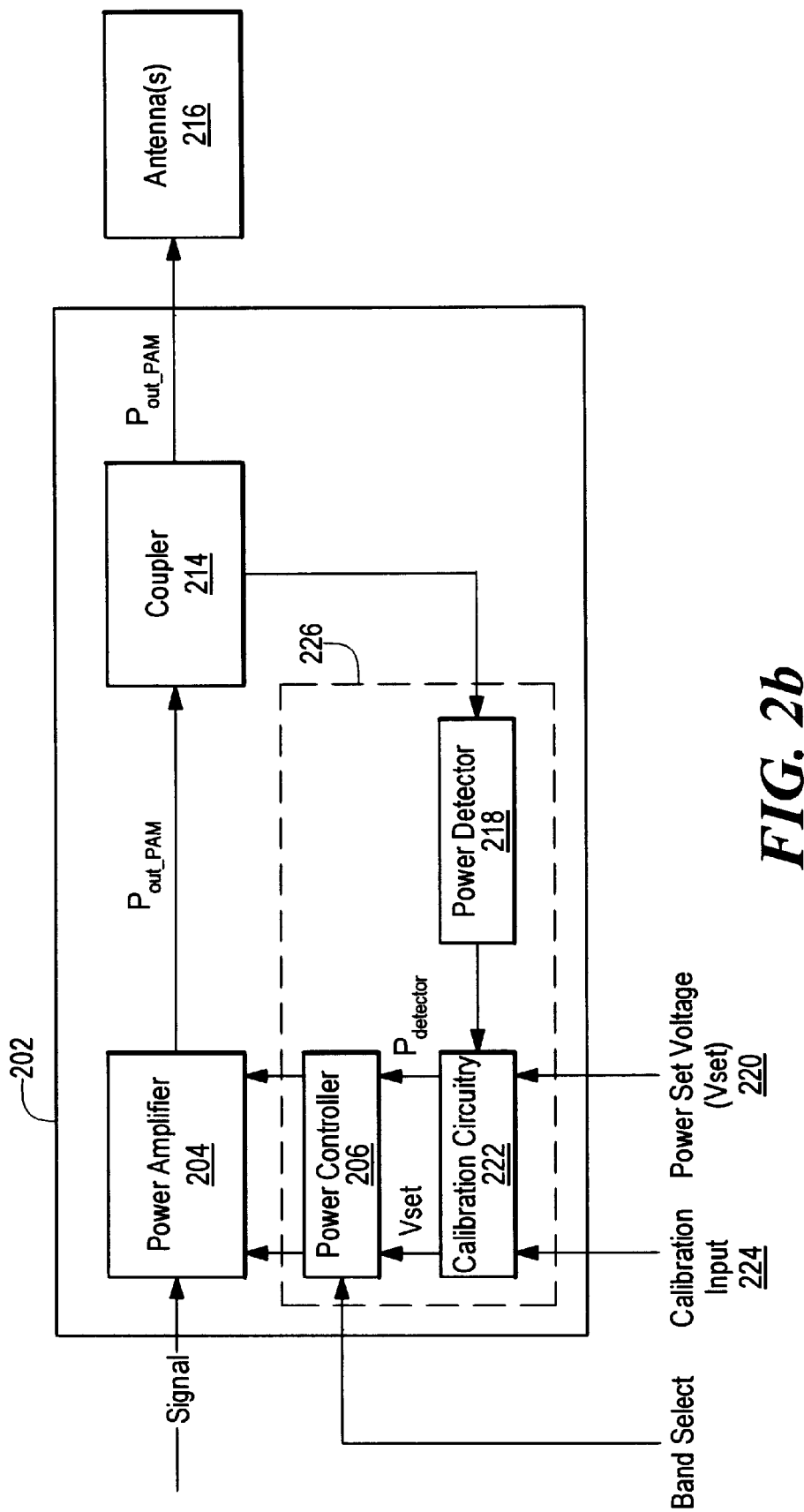
FIG. 2b is a schematic block diagram of a calibrated power amplifier module in accordance with an alternative embodiment of the invention.
Figure 2C:
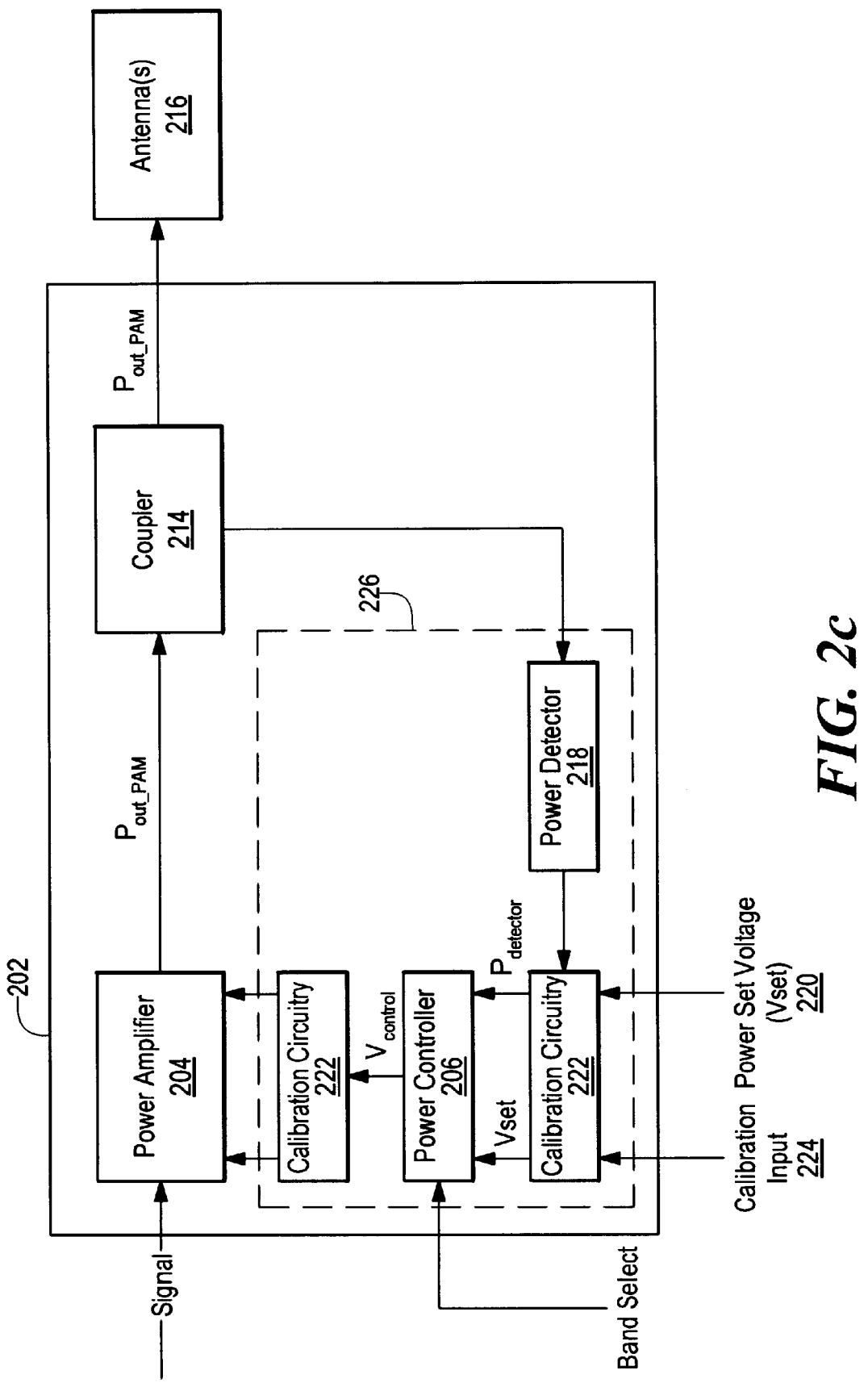
FIG. 2c is schematic block diagram of a calibrated power amplifier module in accordance with an alternative embodiment of the invention.

Without calibration circuitry 222, the actual output power of PAM 202 would deviate from the required power level due to errors from, for example, detector 218 and coupler 214 due to the factors mentioned above. The calibration circuitry 222 may be used to adjust various values such as the power set voltage ($V_{set}$), the measured output power ($P_{detector}$) the control signal ($V_{control}$) produced by the power controller 206 or any combination of these values. FIG. 2a shows calibration circuitry 222 used to correct the power set voltage $V_{set}$ 222. FIG. 2b shows an alternative embodiment of a calibrated PAM 202 in which $V_{set}$ and $P_{detector}$ are corrected using calibration circuitry 222. FIG. 2c shows a further embodiment of a calibrated PAM 202 in which $V_{set}$, $P_{detector}$ and the control signal $V_{control}$ are corrected using calibration circuitry 222. As mentioned, any combination of these values may also be corrected using calibration circuitry 222.

Returning to FIG. 2a, the calibration circuitry may perform a mathematical function that includes a number of predetermined calibration (or correction) coefficients for the PAM. There are many known correction or calibration formulas known in the art that may be used. The calibration coefficients are based on the PAM's behavior in various conditions (e.g., over a given temperature or power level range). In one embodiment, the calibration coefficients for the PAM may be determined by measuring the power set voltage 220 required to produce each required power level in a range of required power levels over ranges of frequency, temperature, voltage or other system variable. These measurements determine the errors between the actual power produced by PAM 202 and the power set voltage ($V_{set}$). These errors provide an indication of which direction $V_{set}$ (or $P_{detector}$ or $V_{control}$ or a combination thereof) needs to be adjusted to eliminate the errors.

In an alternative embodiment, the calibration coefficients are determined by measuring a small subset of power set voltages required to produce a subset of the required power levels over a subset of frequencies, temperatures, etc. Known trends about the variation in output power versus the power set voltage and the various system variables (e.g., temperature, frequency, etc.) may then be applied to compute the calibration coefficients.

Once the calibration coefficients are determined, they are programmed into the calibration circuitry 222. In one embodiment, the calibration circuitry consists of laser trimmed resistors. An analog voltage may be used to burn in calibration (or correction) coefficient(s) in the calibration circuitry 222. Alternatively, the calibration circuitry 222 may be programmed digitally with the calibration (or correction) coefficient(s). A calibration pin (or pins) may be used as the calibration input 224 to input voltages to program the calibration coefficients used to determine a correction as described above. The voltages may be used to open resistor or diode ladder networks.

As mentioned above, the calibration circuitry 222 is used to calculate any correction or adjustment for the power measurements to compensate for measurement errors due to variations in a number of system variables. In one embodiment, as shown in FIG. 2a, the calibration circuitry corrects the measured output power for a given power set voltage ($V_{set}$) 220 by modifying the power set voltage such that $V_{set}'=f(V_{set})$. The corrected power set voltage; $V_{set}'$, is then sent to the power controller 206 to be used to produce a desired power level ($P_{set}$) that is then compared against the measured output power ($P_{detector}$) The function, f, of the calibration circuitry 222 may be designed so that $V_{set}'$ has the inverse of the errors present at the measured output power. Thus, the errors will cancel and the power controller will deliver a control voltage ($V_{control}$) signal to the power amplifier 204 necessary to produce the desired output power.

As mentioned above, in various other embodiments (as shown for example, in FIGS. 2b and 2c), the calibration circuitry may be used to perform similar functions on the measured output power ($P_{detector}$), the control signal ($V_{control}$) or some combination of $V_{set}$, $P_{detector}$ and $V_{control}$.

Accordingly, PAM 202 in FIG. 2a advantageously includes power detection, calibration and control functions so that the output power of a signal may be corrected and adjusted to match an analog or digital power set point over a range of temperatures, dynamic output powers etc., before being incorporated into an application such as a mobile handset. In one embodiment, the power amplifier, power detector, power control and calibration functions are all included on a single semiconductor die.

Figure 3:
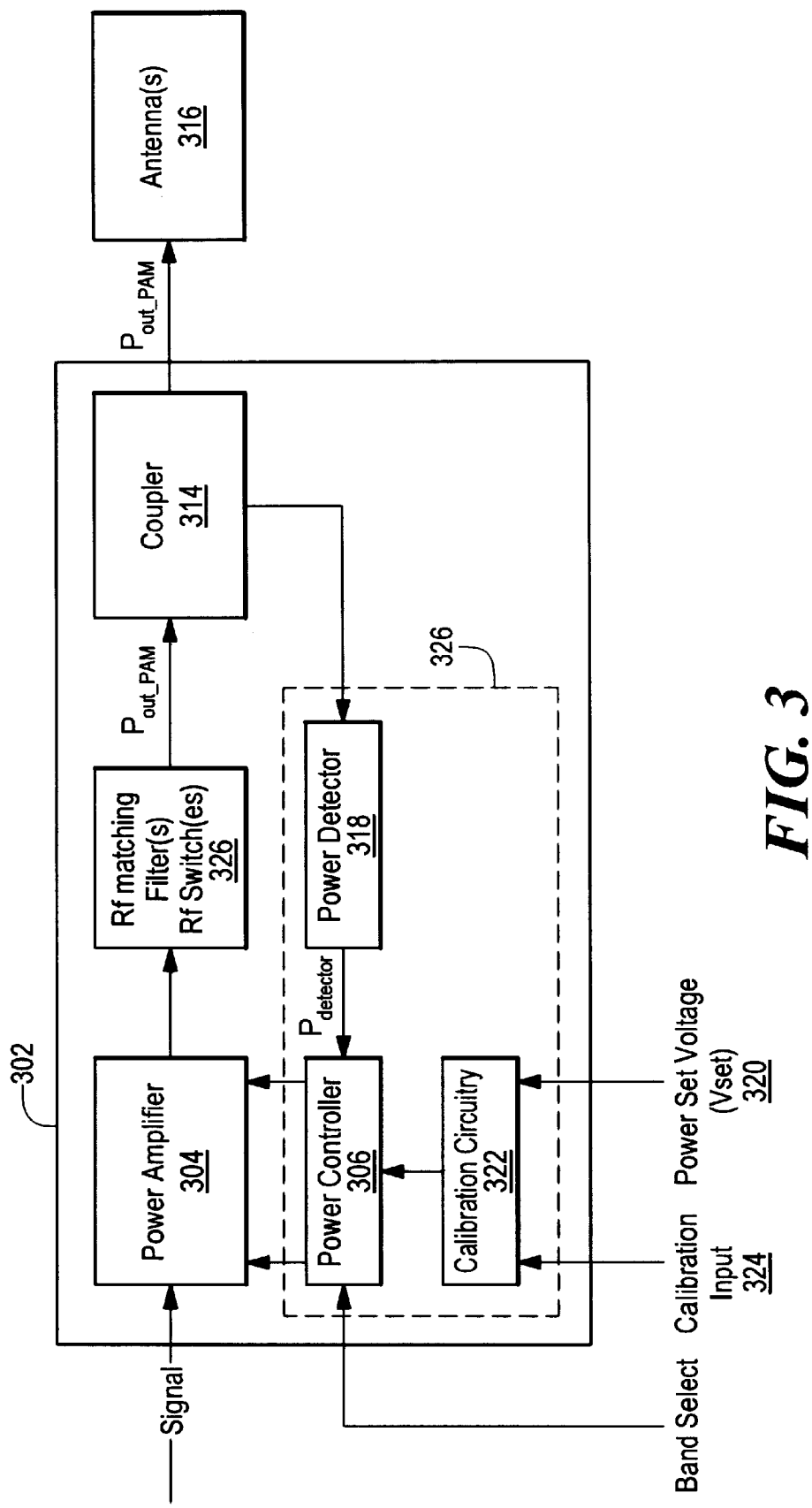
FIG. 3 is a schematic block diagram of a calibrated power amplifier module in accordance with an alternative embodiment of the present invention.

In another embodiment, the power amplifier module may include additional functions as shown in FIG. 3. The power amplifier module 302 may also include RF matching elements 326 such as ceramic capacitors and inductors. In addition, filters 326 and RF switches 326 may be included in the PAM 202.

Although various exemplary embodiments of the invention have been disclosed, it should be apparent to those skilled in the art that various changes and modifications can be made that will achieve some of the advantages of the invention without departing from the true scope of the invention. These and other obvious modifications are intended to be covered by the appended claims.

I claim:
1. A power amplifier module comprising:
   a. an input for receiving a signal having an input power level;
   b. at least one power amplifier coupled to the input to increase the input power level of the signal to an output power level;
   c. a power detector in signal communication with the at least one power amplifier to measure the output power level;
   d. a power controller for comparing the output power level to a target power level and producing a control signal for the power amplifier based on the comparison; and
   e. static calibration circuitry coupled to the power controller for providing one or more power offset corrections for a plurality of power levels.

2. A power amplifier module according to claim 1, wherein the static calibration circuitry adjusts the target power level based on the correction.

3. A power amplifier module according to claim 1, wherein the static calibration circuitry adjusts the measured output power level provided by the power detector based on the correction.

4. A power amplifier module according to claim 1, wherein the static calibration circuitry adjusts the control signal produced by the power controller based on the correction.

5. A power amplifier module according to claim 1 further including a power set interface coupled to the power detector for providing the target power level.

6. A power amplifier module according to claim 1, further including at least one power sampling element coupled to the at least one power amplifier and the power detector for sampling a portion of the output power level and delivering the sampled output power to the power detector.

7. A power amplifier module comprising:
   a. an input for receiving a signal having an input power level;

b. at least one power amplifier coupled to the input to increase the input power level of the signal to an output power level;

c. a power detector in signal communication with the at least one power amplifier to measure the output power level;

d. a power controller for comparing the output power level to a target power level and producing a control signal for the power amplifier based on the comparison; and e. a power calibrator coupled to the power controller for determining a correction based on a set of factors;

wherein the power detector is a logarithmic amplifier.

8. A power amplifier module comprising:

a. an input for receiving a signal having an input power level;

b. at least one power amplifier coupled to the input to increase the input power level of the signal to an output power level;

c. a power detector in signal communication with the at least one power amplifier to measure the output power level;

d. a power controller for comparing the output power level to a target power level and producing a control signal for the power amplifier based on the comparison; and e. a power calibrator coupled to the power controller for determining a correction;

wherein the power calibrator includes a set of laser trimmed resistors.

9. A power amplifier module according to claim 1, further including a set of calibration pins coupled to the static calibration circuitry for receiving a voltage to program at least one of a set of factors used for determining the correction.

10. A power amplifier module according to claim 1, wherein at least one of a set of factors used for determining the correction is programmed digitally in the static calibration circuitry.

11. A power amplifier module according to claim 5, wherein the power set interface is a digital interface.

12. A power amplifier module according to claim 5, wherein the power set interface is an analog interface.

13. A power amplifier module according to claim 1, wherein the at least one power amplifier, the power detector, the power controller and the static calibration circuitry are implemented on a single semiconductor die.

14. A power amplifier module according to claim 1, further including RF matching elements.

15. A power amplifier module according to claim 1, further including RF switches.

16. A power amplifier module according to claim 1, wherein the power set interface provides a controlled power burst.

17. A power amplifier module comprising:

a. an input for receiving a signal with an input power level;

b. at least one power amplifier coupled to the input for increasing the input power level of the signal to an output power level;

c. means for measuring the output power level coupled to the at least one power amplifier;

d. means for comparing the measured output power level to a target power level and producing a control signal;

e. means for adjusting at least one of the measured output power level, the target power level and the control signal using a correction.

18. A power amplifier module according to claim 17, further including a power set interface for providing the target power level.

19. A power amplifier module according to claim 17, further including means for sampling the output power level from the at least one power amplifier.

20. A power amplifier module according to claim 17, further including a set of calibration pins coupled to the means for adjusting for receiving a voltage to program at least one of a set of factors used for determining the correction.

21. A power amplifier module according to claim 17, wherein at least one of a set of factors used for determining the correction is programmed digitally in the adjusting means.

22. A power amplifier module according to claim 18, wherein the power set interface is a digital interface.

23. A power amplifier module according to claim 18, wherein the power set interface is an analog interface.

24. A power amplifier module comprising:

a. an input for receiving a signal having an input power level;

b. at least one power amplifier coupled to the input to increase the input power level of the signal to an output power level; and c. a power calibration and control module coupled to the at least one power amplifier for measuring the output power level, providing stored calibration correction values and correcting the output power level measurement.

25. A power amplifier module according to claim 24, wherein the power calibration and control module controls the at least one power amplifier to produce an output power level equivalent to a target power level.

26. A power amplifier module according to claim 25, further including a power set interface coupled to the power calibration and control module for providing the target power level.

27. A power amplifier module according to claim 24, further including at least one power sampling element coupled to the at least one power amplifier for sampling a portion of the output power level of the signal and delivering the sampled output power level to the power calibration and control module.

28. A power amplifier module according to claim 26, wherein the power set interface is a digital interface.

29. A power amplifier module according to claim 26, wherein the power set interface is an analog interface.

* * * * *